(12) United States Patent
Kopta

(10) Patent No.: US 9,048,340 B2
(45) Date of Patent: Jun. 2, 2015

(54) POWER SEMICONDUCTOR DEVICE WITH A REDUCED DYNAMIC AVALANCHE EFFECT AND SUBSEQUENT LOCAL HEATING

(75) Inventor: Arnost Kopta, Zurich (CH)

(73) Assignee: ABB TECHNOLOGY AG, Zurich (CH)

( * ) Notice: Subject to any disclaimer, the term of this patent is extended or adjusted under 35 U.S.C. 154(b) by 439 days.

(21) Appl. No.: 12/417,774

(22) Filed: Apr. 3, 2009

(65) Prior Publication Data

US 2009/0200574 A1 Aug. 13, 2009

Related U.S. Application Data

(63) Continuation of application No. PCT/EP2007/060462, filed on Oct. 2, 2007.

(30) Foreign Application Priority Data

Oct. 5, 2006 (EP) .................................... 06405423

(51) Int. Cl.
*H01L 29/861* (2006.01)
*H01L 29/06* (2006.01)

(52) U.S. Cl.
CPC ......... *H01L 29/8611* (2013.01); *H01L 29/0619* (2013.01)

(58) Field of Classification Search
USPC ................... 257/168, 172, E29.329, E29.332
See application file for complete search history.

(56) References Cited

U.S. PATENT DOCUMENTS

| 4,377,816 | A | | 3/1983 | Sittig |
| 5,162,876 | A | * | 11/1992 | Kitagawa et al. ............. 257/138 |
| 5,945,691 | A | | 8/1999 | Tomomatsu et al. |
| 6,351,024 | B1 | | 2/2002 | Ruff et al. |
| 2005/0035405 | A1 | | 2/2005 | Mauder et al. |

FOREIGN PATENT DOCUMENTS

| DE | 196 11 689 A1 | 1/1997 |
| DE | 198 04 580 A1 | 8/1999 |
| DE | 103 30 571 A1 | 2/2005 |
| EP | 0 485 059 A2 | 5/1992 |
| EP | 0 794 578 A1 | 9/1997 |
| FR | 1490051 | 6/1967 |

OTHER PUBLICATIONS

Form PCT/ISA/210 (International Search Report) dated Mar. 27, 2008.

(Continued)

*Primary Examiner* — Thomas L Dickey
(74) *Attorney, Agent, or Firm* — Buchanan Ingersoll & Rooney PC

(57) ABSTRACT

A power semiconductor device includes a first layer of a first conductivity type, which has a first main side and a second main side opposite the first main side. A second layer of a second conductivity type is arranged in a central region of the first main side and a fourth electrically conductive layer is arranged on the second layer. On the second main side a third layer with a first zone of the first conductivity type with a higher doping than the first layer is arranged followed by a fifth electrically conductive layer. The area between the second layer and the first zone defines an active area. The third layer includes at least one second zone of the second conductivity type, which is arranged in the same plane as the first zone. A sixth layer of the first conductivity type with a doping, which is lower than that of the first zone and higher that that of the first layer, is arranged between the at least one second zone and the first layer.

12 Claims, 3 Drawing Sheets

(56) References Cited

OTHER PUBLICATIONS

Form PCT/ISA/237 (Written Opinion of the International Searching Authority) dated Mar. 27, 2008.
European Search Report dated Apr. 12, 2007.

Notification Concerning Transmittal of International Preliminary Report on Patentability (Form PCT/IB/326 and PCT/IB/373), Written Opinion of the International Search Authority (Form PCT/ISA/237) issued in corresponding International Patent Application No. PCT/EP2007/060462, Apr. 16, 2009, The International Bureau of WIPO, Geneva, CH.

* cited by examiner

POWER SEMICONDUCTOR DEVICE WITH A REDUCED DYNAMIC AVALANCHE EFFECT AND SUBSEQUENT LOCAL HEATING

RELATED APPLICATIONS

This application claims priority under 35 U.S.C. §119 to EP Application 06405423.2 filed in Europe on Oct. 5, 2006, and as a continuation application under 35 U.S.C. §120 to PCT/EP2007/060462 filed as an International Application on Oct. 2, 2007 designating the U.S., the entire contents of which are hereby incorporated by reference in their entireties.

TECHNICAL FIELD

The disclosure relates to the field of power electronics and more particularly to a power semiconductor device.

BACKGROUND INFORMATION

A vertical power diode typically comprises a low $n^-$ doped base layer, a high $n^+$ doped cathode layer on one side of the base layer and a high $p^+$ doped anode layer on the other side of the base layer. The anode and cathode layers are typically formed by implantation and a subsequent diffusion of dopants into an $n^-$ doped substrate (wafer). On their outer side the cathode layer and the anode layer are covered with metal layers for electrically contacting the diode. The cathode diffusion and metallization normally extend to the physical edge of the device. The anode diffusion, on the other hand, has to be terminated at some distance from the edge in order to be able to support an electric field when reverse biased. Normally, this is done by limiting the $p^+$ doped anode layer to the central part of the diode and surrounding it by a field-limiting junction termination. The anode metallization thereby has about the same size as the p+ doped anode layer itself. The area between the $p^+$ doped anode layer and the $n^+$ doped cathode layer is normally defined as the active area of the diode.

A typical application for such a power diode is as a freewheeling diode in an IGBT inverter circuit. In such an application, the critical part of the diode operation appears when the diode is switched-off from the conducting on-state to the blocking off-state as the IGBT is switched on.

When the diode is forward biased, the anode will inject holes and the cathode will inject electrons into the $n^-$ base layer. In this way, an electron-hole plasma will be built up and stored in the $n^-$ base layer during the on-state phase. Due to the fact that the $p^+$ doped anode layer is smaller in the lateral direction than the $n^+$ doped cathode layer, a significant electron-hole plasma will thereby also be stored in the $n^-$ base layer underneath the anode junction-termination area. When the IGBT is switched on, the diode current will start decreasing with a current change $di_F/dt$, determined by the switching speed of the IGBT. Due to the carriers stored in the $n^-$ base layer, the pn-junction is, however, not capable of supporting a reverse voltage right away. Eventually, the diode current will therefore reach zero and continue to increasingly negative values. At this stage, the stored holes will start flowing back to the anode and the stored electrons into the cathode contacts. After some time the pn-junction will be free of stored carriers and an electric field will start forming, supporting an ever increasing reverse voltage as the stored electron-hole plasma further gets swept out. Holes stored in the area of the $n^-$ base layer underneath the junction-termination will mainly flow into the edge of the $p^+$ anode layer. Due to the curvature of the diffusion profile, the electric field will evidently be higher at this point than in the central part of the anode where 1D conditions prevail, i.e. the electric field in the central part has no component in the lateral direction. Especially during fast switch-off processes comprising high current changes $di_F/dt$s, the hole current density can be very high and thereby act as an additional positive space charge. This additional charge will further increase the electric field strength at the anode edge. If the electric field exceeds the critical strength, avalanche generation will set in (dynamic avalanche effect), and a further increase in current density will result. The combination of a high current density and a high electric field will lead to high power dissipation in this region. This can lead to a local thermal runaway and subsequent failure of the diode. In case of high IGBT switching speed, i.e. large current change $di_F/dt$, high DC-link voltage, high circuit stray inductance, high initial diode forward current and a high diode temperature the situation will become more critical, and therefore, the probability of failure of the diode will rise.

DE 198 04 580 shows different embodiments of a power semiconductor diode by which such a before mentioned edge failure effect can be avoided. The proposed methods can be divided into two fundamentally different categories: Either the edge of the anode layer can be made less sensitive to the hole current using different termination methods or alternatively, the hole current can be eliminated. In one embodiment the anode layer comprises a $p^+$ highly doped central region, which is surrounded by an outer region of the diode with a lower dopant concentration ($p^-$ doped). In this case, the emitter efficiency of the edge region of the anode will be smaller and therefore less electron-hole plasma will be stored underneath the junction termination area, thus reducing the dynamic avalanche effect during diode turn-off. Alternatively, a non-planar junction termination technique can be used, where the anode layer undergoes an etching process, leaving a mesa-like $p^+$ doped central region with the contact metal placed on top the mesa. Additionally, in another embodiment the $n^+$ doped cathode layer extends only in a central part of the diode and is surrounded by an n doped layer. Alternatively, it is also possible to restrict the cathode metal layer to the central part of the diode. In both cases, the electron emitting area on the cathode side is going to be reduced laterally. The current flow in the outer regions of the diode will be reduced and less charge will be stored there, again reducing the flow of holes into the edge of the anode junction during reverse recovery.

In DE 103 30 571 a vertical diode is shown. The diode has a cathode layer, which is surrounded by a low doped $n^-$ contact area at the edge. By such a cathode the injection of electrons will be extremely reduced, but cannot be completely eliminated.

The document EP 0 485 059 shows a power diode with a highly doped $n^{++}$ layer on the cathode side. Outside the active area, highly doped $p^{++}$ zones are embedded in the $n^{++}$ layer so that the $n^{++}$ and $p^{++}$ zones alternate, the widths of these zones being equal to each other. An $n^+$ doped buffer layer covers the $p^{++}$ zones as well as the $n^{++}$ layer. The $p^{++}$ zones and the $n^{++}$ zones are in contact with the cathode electrode, which covers the complete surface of the diode on the cathode side. As in this device $p^{++}$ zones are alternating with $n^{++}$ zones on the cathode side, carrier injection is reduced from the region outside the active area, but there are still carriers, which can be injected from this region.

U.S. Pat. No. 4,377,816 relates to an avalanche diode with $p^+$ zones surrounding an $n^+$ layer. The p+ zones are arranged in a distance to the $n^+$ layer and the p+ zones are arranged directly adjacent to the $n^-$ doped base layer. The metallization on the cathode side covers only the central part of the device below the $n^+$ layer, because otherwise the carriers would flow over the n⁻ doped base layer directly to the cathode electrode, thus the effect of the n⁺ doped layer would get lost and the maximum field strength would be reduced. Furthermore, for the manufacturing of the cathode metallization an additional masking step is necessary.

FR 1 490 051 and EP 0 794 578 show a diode with p⁺ islands which are arranged on the cathode side within the n⁺ layer in the active region in order to inject holes during recovery, thus improving diode recovery softness.

SUMMARY

A power semiconductor diode is disclosed with an improved robustness during turn-off (reverse recovery) in order to avoid or at least reduce a dynamic avalanche effect and a subsequent local heating of the edge of the anode diffusion.

A power semiconductor device with a first layer of a first conductivity type is disclosed, which has a first main side and a second main side opposite the first main side, a second layer of a second conductivity type, which is arranged in a central region of the first main side, a fourth electrically conductive layer, which is arranged on the second layer on the side opposite the first layer, a third layer, which is arranged on the second main side and which comprises a first zone of the first conductivity type with a higher doping than the first layer, and a fifth electrically conductive layer, which is arranged on the third layer on the side opposite the first layer, the area between the second layer and the first zone defining an active area, wherein the third layer comprises a second zone of the second conductivity type, which is arranged in the same plane as the first zone and which second zone completely surrounds the first zone, wherein a sixth layer of the first conductivity type with a doping, which is lower than that of the first zone and higher that that of the first layer, is arranged between the at least one second zone and the first layer, and wherein the fifth electrically conductive layer completely covers that side of the third layer, which lies opposite the first layer.

In another aspect, a method of arrangement of a power semiconductor device is disclosed. Such a method comprises arranging a first main side of a first layer of a first conductivity type opposite a second main side of the first layer of a first conductivity type; arranging in a central region of the first main side a second layer of a second conductivity type; arranging a fourth electrically conductive layer on the second layer on the side opposite the first layer; arranging on the second main side a third layer which comprises a first zone of the first conductivity type with a higher doping than the first layer, the third layer comprising a second zone of the second conductivity type, which is arranged in the same plane as the first zone and which second zone surrounds the first zone, the area between the second layer and the first zone defining an active area; arranging a fifth electrically conductive layer on the third layer on the side opposite the first layer, the fifth electrically conductive layer covering a side of the third layer which lies opposite the first layer; and arranging between the second zone and the first layer a sixth layer of the first conductivity type with a doping, which is lower than that of the first zone and higher than that of the first layer.

BRIEF DESCRIPTION OF DRAWINGS

The subject matter of the disclosure will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
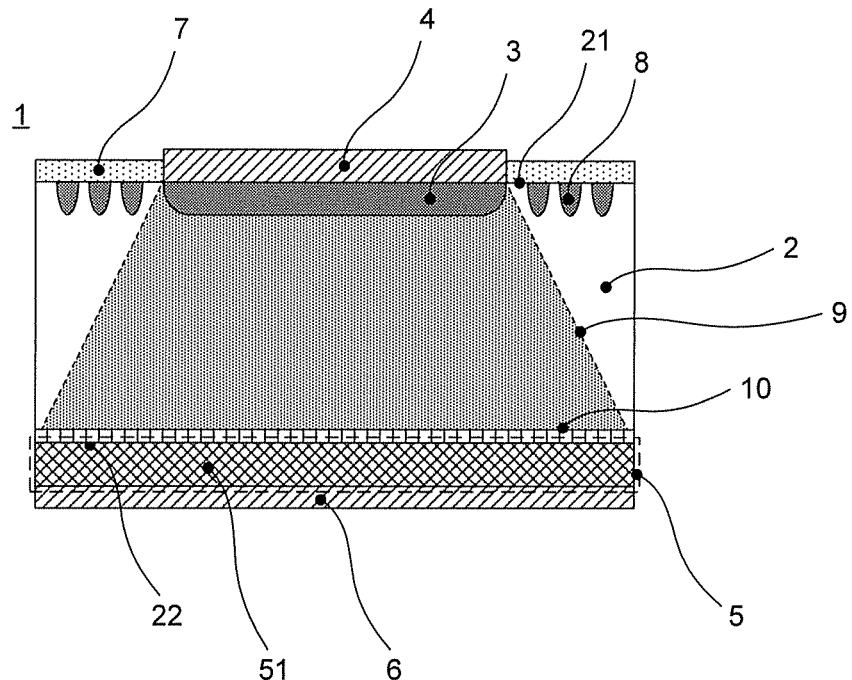
FIG. 1 shows a cross-sectional view on a power semiconductor device according to the prior art.

An exemplary embodiment of a power semiconductor device comprises a first layer of a first conductivity type, which has a first main side and a second main side opposite the first main side, a second layer of a second conductivity type, which is arranged in a central region of the first main side, a fourth electrically conductive layer, which is arranged on the second layer on the side opposite the first layer, a third layer, which is arranged on the second main side and which comprises a first zone of the first conductivity type with a higher doping than the first layer, and a fifth electrically conductive layer, which is arranged on the third layer on the side opposite the first layer. The area between the second layer and the first zone defines an active area, in which area the current flows, when the diode is forward biased. The third layer comprises a second zone of the second conductivity type, which is arranged in the same plane as the first zone and which second zone completely surrounds the first zone. The second zone can entirely cover the fifth electrically conductive layer around the active area, e.g., the area between the first zone and the border of the device. A sixth layer of the first conductivity type with a doping, which is lower than that of the first zone, but higher that that of the first layer, is arranged between the at least one second zone and the first layer.

Such an exemplary power semiconductor diode is robust during turn-off because the dynamic avalanche effect and excessive local heating at the edge of the pn-junction of the active area caused by stored holes flowing back into the second layer can be avoided. This is achieved by limiting the emitting area of the first zone of the first conductivity type to approximately the same size as the second layer by introducing a second zone of the second conductivity type on the edge of the first zone. In the second zone, no carriers will be emitted during on-state and in this way no additional charge will be stored in the first layer underneath the junction termination of the second layer. Thereby, no carriers are injected from the whole area surrounding the active area, i.e. from the area surrounding the first zone. The second zone can be arranged as a continuous layer, which surrounds the first zone and covers the whole edge of the device between the active area and the border. Due to the introduction of the second zone, the injection of carriers (electrons) during on-state can be completely stopped. During reverse recovery, the hole current through the high electric field area around the edge of the second layer will be eliminated or at least greatly reduced. In this way, a higher reverse recovery safe operating area can be achieved and the device can be operated at higher forward currents, higher reverse voltages, higher junction temperature and higher commutating current changes per time ($di_F/dt$)

compared to a conventional device. The on-state voltage drop will not be affected appreciably by the introduction of the at least one second zone, because the area underneath the junction termination does not carry much of the current.

In an exemplary embodiment, the fifth electrically conductive layer completely covers that side of the third layer, which is arranged opposite the first layer. The manufacturing of such a metallization is easy, because no mask is needed to achieve the layer, thus reducing costs and avoiding delicate masking steps. The advantage of no carriers being injected from outside the active area, i.e. from the area surrounding the first zone, can be maintained even with such a metallization over the complete side, because due to the second zone, which completely surrounds the first zone, still no carriers can be injected.

The structure on the second main side has to be aligned in relation to the second layer on the first main side. Because the structure on the second main side is relatively course, this alignment can be easily achieved and the exemplary semiconductor device can be produced easily and without delicate manufacturing steps.

In FIG. 1 a power semiconductor device 1 according to the prior art is shown. The semiconductor device 1 comprises an n⁻ doped first layer 2, which forms the base layer. The first layer has a first main side 21, which is the anode side, and a second main side 22, which is the cathode side and which lies opposite the first main side 21. On the first main side 21 a second p⁺ doped layer 3, which forms an anode layer, is arranged in a central region of the first main side 21. A fourth electrically conductive layer 4 is arranged on the second layer 3 on the side opposite the first layer 2. The fourth layer 4 forms the anode electrical contact and it is typically a metallization, which completely covers the second layer 3. It is surrounded by an insulation layer 7. On the first main side 21, in a termination region, which lies under the insulation layer 7, often p doped protection regions (junction termination) 8 are arranged. These protection regions 8 surround the second layer 3. The protection region can be made using for example floating guard rings.

On the second main side 22, a third layer 5 is arranged (area surrounded by a course dotted line in FIG. 1), which comprises a first n⁺ doped zone 51. The doping concentration of the first zone 51 is higher than that of the first base layer 2. Laterally the third layer 5 may extend to the border of the semiconductor device 1 or it may be arranged only in a central region on the second main side 22. A fifth electrically conductive layer 6 is arranged on the third layer 5 on the side opposite the first layer 2. The fifth layer 6 forms the cathode electrical contact and it is typically a metallization. The area between the second layer 3 and the first zone 51 defines the active area 9 of the diode (area surrounded by a fine dotted line in FIG. 1). A sixth n doped layer 10, which forms a buffer layer, may be arranged between the first n⁺ doped zone 51 and the first base layer 2. The doping of the sixth layer 10 is lower than the doping of the first n+ doped zone 51, but higher than the doping of the first layer 2.

Figure 2:
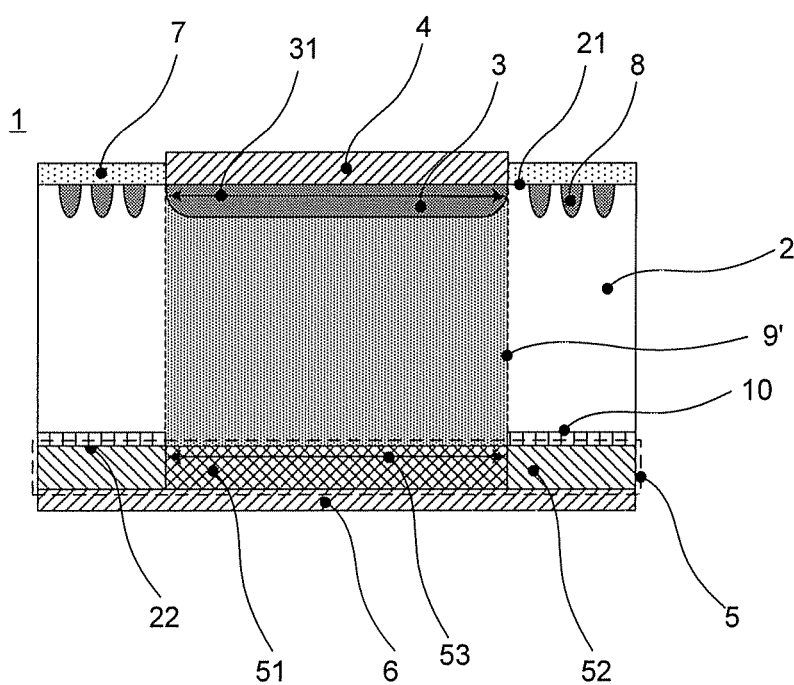
FIG. 2 shows a cross-sectional view on a first embodiment of a power semiconductor device according to the disclosure.

FIG. 2 shows a cross-sectional view on a first exemplary embodiment of a power semiconductor device 1, in particular a power diode. The construction of the semiconductor device is the same as for the semiconductor device as shown in FIG. 1, besides that the third layer 5 comprises a first n⁺ doped zone 51 and a p⁺ doped second zone 52, which is arranged in the same plane as the first zone 51 and at the edge of the device. The second zone 52 completely surrounds the first zone 51. The first base layer 2 is not in direct contact with the fifth electrically conductive cathode layer 6. At least part of the first zone 51 is arranged within a region directly opposite the second layer 3. A sixth layer 10, which forms a buffer layer, is arranged between the p⁺ doped second zone 52 and the first base layer 2. In this embodiment, zone 52 is arranged directly adjacent to the first zone 51, so that the zones 51, 52 are in contact to each other and form a continuous layer, which completely covers the first layer 2 and sixth layer 10 on the second main side 22. The second zone 52 can completely cover the fifth electrically conductive layer 6 on its side towards the first layer 2 around the active area 9, 9', 9", 9'" and the sixth layer 10. The sixth buffer layer 10 is diffused deeper into the first layer than the p⁺ doped second zone 52, typically it has a surface concentration of less than $10^{16}$ cm⁻³, and it is typically arranged in a depth (measured from the side of the third layer 5 opposite the first layer 2) of 10 μm up to 50 μm. This sixth buffer layer 10 stops the electric field from reaching the p⁺ doped second zone 52 during blocking. The sixth buffer layer 10 may also extend to the region between the first n⁺ doped zone 51 and the first layer 2 or even be a continuous layer that completely covers the first n⁺ doped zone 51 and the p⁺ doped second zone 52, e.g. in form of a ring structure surrounding the active area 9, 9', 9", 9'". In that case, the second zone 52 can completely cover the fifth electrically conductive layer 6 on its side towards the first layer 2 around the active area 9, 9', 9", 9'" and the sixth layer 10.

Alternatively to what is described above, there may be a lateral distance between the first n⁺ doped zone 51 and the p⁺ doped second zone 52, i.e. the first n⁺ doped zone 51 does not touch on the p⁺ doped second zone 52, and the second zone 52 completely surrounds the first zone 51. In this case, the sixth buffer layer 10 has to be arranged between the p⁺ doped second zone 52 and the first layer 2 as well as in the region between the first n⁺ doped zone 51 and the p⁺ doped second zone 52 so that the first base layer 2 is not in direct contact with the fifth electrically conductive cathode layer 6. In this case, the sixth buffer layer 10 stops the electric field from reaching the p⁺ doped second zone 52 and the fifth electrically conductive cathode layer 6 in those parts, which are neither covered by a first nor a second zone 51, 52 during blocking. Also in this case, no carriers can be injected from the second zone 52.

In FIG. 2 the first zone 51 is arranged symmetrically to the position of the second anode layer 3. The width 31 of the second anode layer 3 corresponds to, i.e. is the same as the width 53 of the first zone 51. The active area 9' is limited to the field between the second anode layer 3 and the first n⁺ doped zone 51. During on-state the p+ zone 52 will not emit any carriers into the first base layer 2. Therefore, no stored charge will exist in the n⁻ doped first base layer 2 underneath the p+ doped second zone 52 at the edge of the device. When the diode is switched off, the back-flow of holes at the edge of the second base layer 3 will be eliminated and thus, the dynamic avalanche effect will be avoided and the dissipated power density will be lowered.

Figure 3:
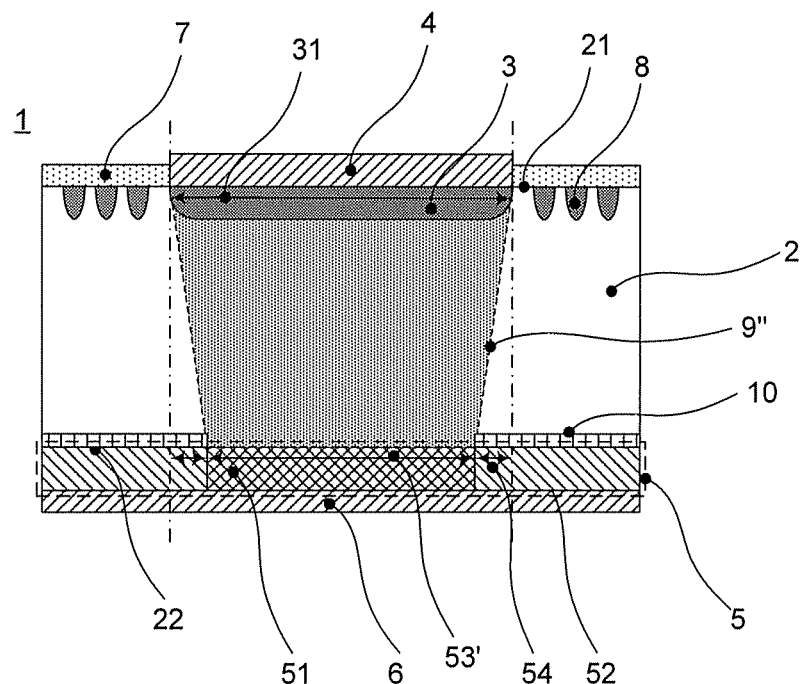
FIG. 3 shows a cross-sectional view on a further embodiment of a power semiconductor device according to the disclosure.

In FIG. 3 another exemplary embodiment of a power semiconductor device 1 is shown. The width 53' of the first zone 51 is smaller than the width 31 of the second anode layer 3. In FIG. 3 the first zone 51 lies symmetrically to the second anode layer 3, i.e. the first zone 51 is smaller than the second anode layer 3 and the borders of the first zone 51 are shifted in relation to the borders of the second anode layer 3 on both sides by the same distance 54. The active area 9" is smaller than it is in the exemplary embodiment of the semiconductor device 1 as shown in FIG. 2.

Figure 5:
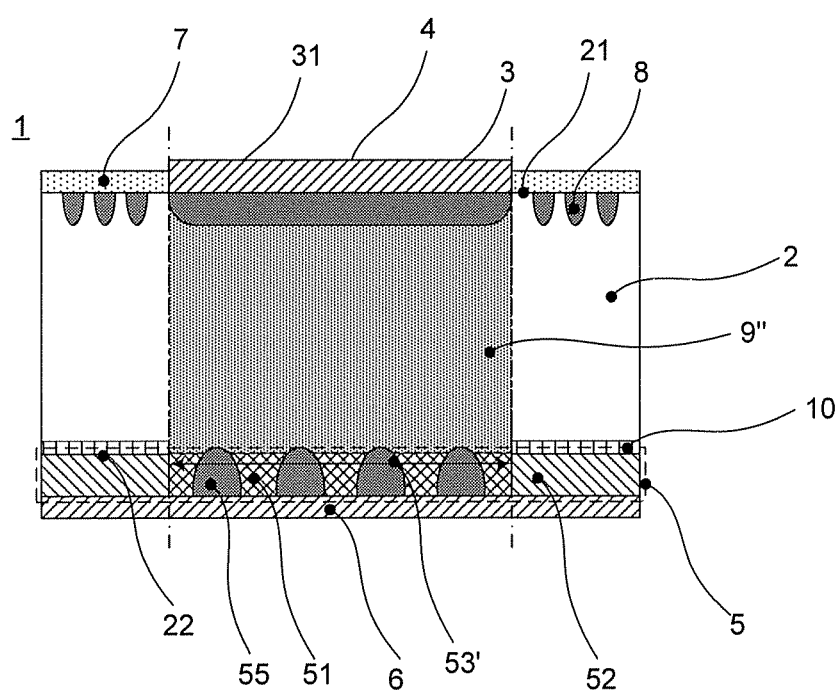
FIG. 5 shows a cross-sectional view on a further embodiment of a power semiconductor device according to the disclosure.

In FIG. 5 another exemplary embodiment of a power semiconductor device 1 is shown. Within the at least one first zone 51 at least one p⁺ highly doped third zone 55 is arranged. The at least one first zone 51 and the at least one third zone 55 touch on each other. With this semiconductor device 1 the recovery softness during switch-off of the semiconductor device 1 is improved, i.e. a sudden snap-off of the reverse recovery current with an associated overshoot voltage and subsequent oscillations is prevented. Furthermore, the safe operating area is enhanced due to the fact that such a device will self-limit the overshoot voltage during turn-off. For the manufacturing of such a semiconductor device 1 the at least one p+ highly doped third zone 55 can be manufactured in the same step as the p+ doped second zone 52 with the same mask and the same implant.

Figure 4:
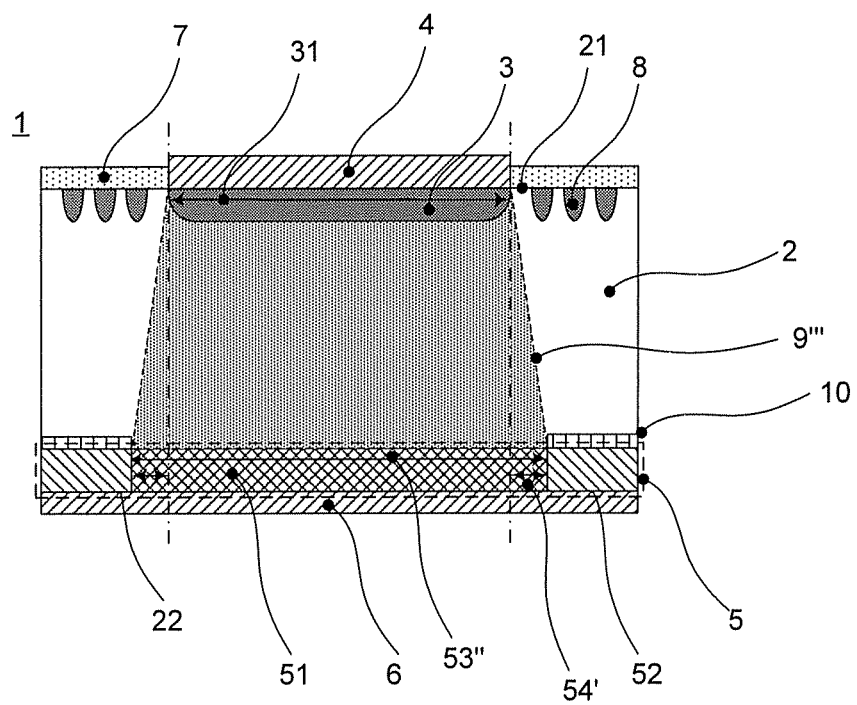
FIG. 4 shows a cross-sectional view on a further embodiment of a power semiconductor device according to the disclosure.

In FIG. 4 another exemplary embodiment of a power semiconductor device 1 is shown. The width 53" of the first zone 51 is larger than the width 31 of the second anode layer 3. In FIG. 4 the first zone 51 lies symmetrically to the second anode layer 3, i.e. the first zone 51 is larger than the second anode layer 3 and the borders of the first zone 51 are shifted in relation to the border of the second anode layer 3 on both sides by the same distance 54'. The distance 54' should be not more than the thickness of the first base layer 2 plus 500 µm, preferably not more than the thickness of the first base layer 2. In this case, the active area 9''' is larger than it is in the exemplary embodiment of the semiconductor device 1 as shown in FIG. 2.

The plasma will spread out from the fourth electrically conductive layer 4 with an angle varying less than 45° from perpendicular direction. Therefore the biggest possible distance 54', should correspond to the thickness of the first base layer 2 plus 500 µm, preferably not more than the thickness of the first base layer 2. The advantage of such a design is that the reverse recovery softness will improve due to a small bipolar-transistor effect.

Of course it is also possible in case that the first zone 51 has a different width than the second layer 3 (larger or smaller) that the first zone 51 is shifted in relation to the border of the second layer 3 asymmetrically, so that the distance 54, 54' on one side of the first zone 51 differs from the width 54, 54' on the other side of the first zone 51 (not shown in a figure).

As shown in the FIG. 2 to 5, such an exemplary semiconductor device comprises in an exemplary embodiment p doped protection regions 8, which surround the second anode layer 3 and which form guard rings. Alternatively to guard rings, other designs for the protection regions 8 are possible. These protection regions 8 are advantageous for the diode to be able to block.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST 1 semiconductor device
2 first layer
21 first main side
22 second main side
3 second layer
31 width of the second layer
4 fourth layer
5 third layer
51 first zone
52 second zone
53 width of first zone
54, 54' width difference
55 third zone
6 fifth layer
7 insulation layer
8 protection region
9, 9', 9'', 9''' active area
10 sixth layer

What is claimed is:

1. A method of arrangement of a power semiconductor device, comprising:
    arranging a first main side of a first layer of a first conductivity type opposite a second main side of the first layer of a first conductivity type;
    arranging in a central region of the first main side a second layer of a second conductivity type;
    arranging a fourth electrically conductive layer on the second layer on the side opposite the first layer;
    arranging on the second main side a third layer which comprises a first zone of the first conductivity type with a higher doping than the first layer, the third layer comprising a second zone of the second conductivity type, which is arranged in the same plane as the first zone and which second zone surrounds the first zone, the area between the second layer and the first zone defining an active area;
    arranging a fifth electrically conductive layer on the third layer on the side opposite the first layer, the fifth electrically conductive layer covering a side of the third layer which lies opposite the first layer;
    arranging between the second zone and the first layer a sixth layer of the first conductivity type with a doping, which is lower than that of the first zone and higher than that of the first layer and
    arranging the second zone in a lateral distance from the first zone, and arranging the sixth layer in the region between the first zone and the second zone.

2. A power semiconductor device with a first layer of a first conductivity type, which has a first main side and a second main side opposite the first main side, a second layer of a second conductivity type, which is arranged in a central region of the first main side, a fourth electrically conductive layer, which is arranged on the second layer on the side opposite the first layer, a third layer, which is arranged on the second main side and which comprises a first zone of the first conductivity type with a higher doping than the first layer, and a fifth electrically conductive layer, which is arranged on the third layer on the side opposite the first layer, the area between the second layer and the first zone defining an active area, wherein
    the third layer comprises a second zone of the second conductivity type, which is arranged in the same plane as the first zone and which second zone completely surrounds the first zone, wherein
    a sixth layer of the first conductivity type with a doping, which is lower than that of the first zone and higher than that of the first layer, is arranged between the second zone and the first layer, wherein
    the fifth electrically conductive layer completely covers that side of the third layer, which lies opposite the first layer and wherein
    the second zone is arranged in a lateral distance from the first zone, and the sixth layer is arranged in the region between the first zone and the second zone.

3. The semiconductor device according to claim 2, wherein the width of the first zone is larger than the width of the second layer on at least one side by a width difference.

4. The semiconductor device according to claim 2, wherein the first zone comprises third zones of the second conductivity type.

5. The semiconductor device according to claim 2, wherein protection regions of the second conductivity type are arranged on the first main side in a region around the second layer.

6. The semiconductor device according to claim 2, wherein the first zone is arranged symmetrically to the second layer and/or to the fourth electrically conductive layer.

7. The semiconductor device according to claim 2, wherein the second zone is arranged directly adjacent to the first zone.

8. The semiconductor device according to claim 7, wherein the second zone completely covers the fifth electrically conductive layer on its side towards the first layer around the active area.

9. The semiconductor device according to claim 7, wherein the first zone is arranged symmetrically to the second layer and/or to the fourth electrically conductive layer.

10. The semiconductor device according to claim 7, wherein the width of the first zone is larger than the width of the second layer on at least one side by a width difference.

11. The semiconductor device according to claim 7, wherein the first zone comprises third zones of the second conductivity type.

12. The semiconductor device according to claim 7, wherein protection regions of the second conductivity type are arranged on the first main side in a region around the second layer.

\* \* \* \* \*